US012598988B2

(12) United States Patent
Iwawaki et al.

(10) Patent No.: US 12,598,988 B2
(45) Date of Patent: Apr. 7, 2026

(54) INTEGRATED CIRCUIT DEVICE

(71) Applicant: Seiko Epson Corporation, Tokyo (JP)

(72) Inventors: Takanori Iwawaki, Suwa (JP);
Motoaki Nishimura, Chino (JP);
Yoshihiko Nimura, Hara (JP); Katsumi Inoue, Matsumoto (JP)

(73) Assignee: SEIKO EPSON CORPORATION (JP)

( * ) Notice: Subject to any disclaimer, the term of this patent is extended or adjusted under 35 U.S.C. 154(b) by 986 days.

(21) Appl. No.: 17/826,262

(22) Filed: May 27, 2022

(65) Prior Publication Data

US 2022/0384294 A1      Dec. 1, 2022

(30) Foreign Application Priority Data

May 31, 2021     (JP) ................................. 2021-090755

(51) Int. Cl.
*H01L 23/34* (2006.01)
*H01L 21/67* (2006.01)
*H02H 3/08* (2006.01)

(52) U.S. Cl.
CPC ...... *H01L 23/345* (2013.01); *H01L 21/67248* (2013.01); *H02H 3/085* (2013.01)

(58) Field of Classification Search
CPC .. H01L 21/67248; H01L 23/345; H02H 3/085
USPC ..................................................... 219/444.1
See application file for complete search history.

(56) References Cited

U.S. PATENT DOCUMENTS

| | | | | |
|---|---|---|---|---|
| 4,642,668 | A | 2/1987 | Tacken | |
| 5,642,252 | A | 6/1997 | Sakamoto et al. | |
| 5,990,691 | A * | 11/1999 | Joerg ................. | G01R 31/2884 |
| | | | | 324/750.11 |
| 6,559,667 | B1 * | 5/2003 | Tarter ................. | G01R 31/2896 |
| | | | | 324/762.02 |
| 2007/0201176 | A1 * | 8/2007 | Yokai ................ | H02M 7/53875 |
| | | | | 361/103 |
| 2016/0099560 | A1 | 4/2016 | Yamada et al. | |
| 2017/0005463 | A1 * | 1/2017 | Michishita ............... | H02H 5/04 |

(Continued)

FOREIGN PATENT DOCUMENTS

| | | |
|---|---|---|
| CN | 204947888 U | 1/2016 |
| JP | S59-117263 A | 7/1984 |

(Continued)

*Primary Examiner* — Sang Y Paik
(74) *Attorney, Agent, or Firm* — Harness, Dickey & Pierce, P.L.C.

(57) ABSTRACT

An integrated circuit device includes a heating element, and a temperature sensor configured to detect a temperature of the heating element. An outer shape of the integrated circuit device has a first side and a second side intersecting the first side, and when a direction along the first side of the integrated circuit device is set as an X direction and a direction along the second side is set as a Y direction, the heating element includes a first heating element, and a second heating element arranged adjacent to the first heating element along the Y direction with a region AR interposed therebetween. The temperature sensor is arranged at an arrangement position where a position in the X direction is a position between a center of the region AR and the second side, and a position in the Y direction is a position between the first heating element and the second heating element.

4 Claims, 12 Drawing Sheets

(56)          References Cited

U.S. PATENT DOCUMENTS

2018/0321094  A1    11/2018  Jang et al.
2019/0067267  A1     2/2019  Shishikura

FOREIGN PATENT DOCUMENTS

JP        H07-050389  A      2/1995
JP        2005-150762 A      6/2005
JP        2011-036016 A      2/2011
JP        2015-208183 A     11/2015
JP        2016-077040 A      5/2016
JP        2019-047104 A      3/2019
WO        2021-059881 A1     4/2021

* cited by examiner

INTEGRATED CIRCUIT DEVICE

The present application is based on, and claims priority from JP Application Serial Number 2021-090755, filed May 31, 2021, the disclosure of which is hereby incorporated by reference herein in its entirety.

BACKGROUND

1. Technical Field

The present disclosure relates to an integrated circuit device.

2. Related Art

JP A-2016-077040 discloses a method for arranging, in a circuit device that drives a direct current motor, a bridge circuit for improving a detection time and detection accuracy of an overheated state.

In JP A-2016-077040, since a shape of a transistor serving as a heating element and an arrangement direction when the transistor is arranged in a specific region on a chip are not considered, heat bias inside the chip occurs. When a temperature sensor is arranged without considering the heat bias, the overheated state cannot be quickly detected and the detection accuracy cannot be improved.

SUMMARY

An aspect of the present disclosure relates to an integrated circuit device including: a heating element; and a temperature sensor configured to detect a temperature of the heating element, in which an outer shape of the integrated circuit device has a first side and a second side intersecting the first side, when a direction along the first side of the integrated circuit device is set as an X direction and a direction along the second side is set as a Y direction, the heating element includes a first heating element, and a second heating element arranged adjacent to the first heating element along the Y direction with a region interposed therebetween, and the temperature sensor is arranged at an arrangement position where a position in the X direction is a position between a center of the region and the second side, and a position in the Y direction is a position between the first heating element and the second heating element.

Another aspect of the present disclosure relates to an integrated circuit device including: a charging transistor configured to charge a load; a discharging transistor configured to discharge the load; a control circuit configured to control a current flowing through the charging transistor and a current flowing through the discharging transistor; a first temperature sensor configured to detect a temperature of the charging transistor; and a second temperature sensor configured to detect a temperature of the discharging transistor, in which an outer shape of the integrated circuit device has a first side and a second side intersecting the first side, when a direction along the first side of the integrated circuit device is set as an X direction and a direction along the second side is set as a Y direction, the charging transistor includes a first charging transistor, and a second charging transistor arranged adjacent to the first charging transistor along the Y direction with a first region interposed therebetween, the discharging transistor includes a first discharging transistor, and a second discharging transistor arranged adjacent to the first discharging transistor along the Y direction with a second region interposed therebetween, the first temperature sensor is arranged at a first arrangement position where a position in the X direction is a position between a center of the first region and the second side, and a position in the Y direction is a position between the first charging transistor and the second charging transistor, and the second temperature sensor is arranged at a second arrangement position where a position in the X direction is a position between a center of the second region and the second side, and a position in the Y direction is a position between the first discharging transistor and the second discharging transistor.

DESCRIPTION OF EXEMPLARY EMBODIMENTS

Hereinafter, a preferred embodiment of the present disclosure will be described in detail. The present embodiment to be described below does not unduly limit contents described in claims, and all configurations described in the present embodiment are not necessarily essential constituent elements.

1. Integrated Circuit Device

Figure 1:
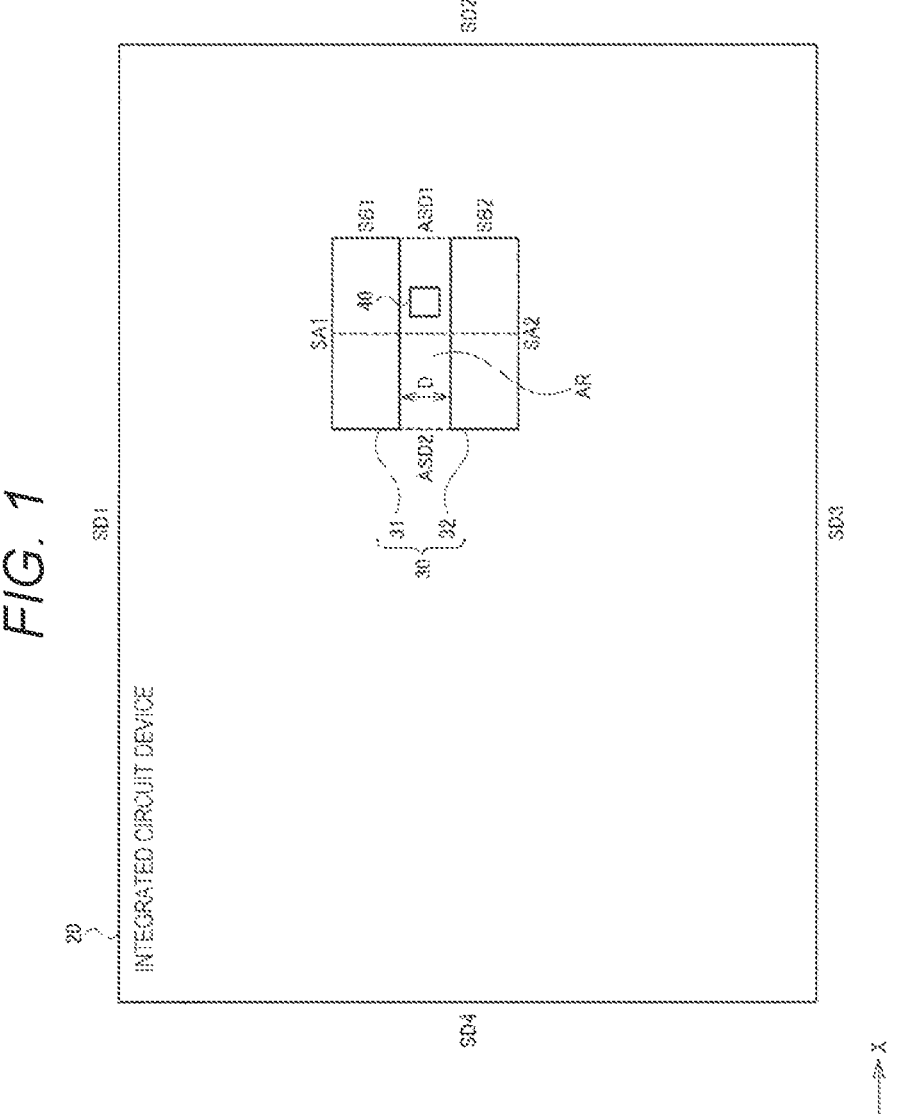
FIG. 1 shows a basic configuration example of an integrated circuit device according to the present embodiment.

FIG. 1 shows a basic configuration example of an integrated circuit device 20 according to the present embodiment. The integrated circuit device 20 includes a heating element 30 and a temperature sensor 40. FIG. 1 and FIGS. 3, 4, 7, 8, 12, and 13 described later show a layout arrangement of the integrated circuit device 20 in a plan view. The plan view is, for example, a plan view in a direction orthogonal to a substrate of the integrated circuit device 20. The integrated circuit device 20 according to the present embodiment can also be used in a heater circuit. In addition, the integrated circuit device 20 according to the present embodiment can be used as a heater circuit used in, for example, an oven-controlled crystal oscillator.

The integrated circuit device 20 is, for example, an integrated circuit (IC) manufactured by a semiconductor process, and is a semiconductor chip in which a circuit element is formed on a semiconductor substrate. An outer shape of the integrated circuit device 20 has a first side SD1 and a second side SD2 intersecting the first side SD1. In addition, the outer shape of the integrated circuit device 20 has a third side SD3 which is an opposite side of the first side SD1 and a fourth side SD4 which is an opposite side of the second side SD2. The outer shape of the integrated circuit device 20 is, for example, an outer shape of a rectangular semiconductor chip that is the integrated circuit device 20. For example, the first side SD1, the second side SD2, the third side SD3, and the fourth side SD4 are sides of a substrate of the semiconductor chip. The semiconductor chip is also referred to as silicon die. In the present embodiment, a direction along the first side SD1 of the integrated circuit device 20 is set as an X direction, and a direction along the second side SD2 is set as a Y direction. In addition, a direction orthogonal to the X direction and the Y direction is set as a Z direction. The Z direction is a direction orthogonal to a semiconductor substrate of the integrated circuit device 20. The X direction, the Y direction, and the Z direction are an X axis direction, a Y axis direction, and a Z axis direction, respectively.

The heating element 30 is an element that generates heat. The heating element 30 can be implemented by, for example, a transistor such as a MOS transistor or a bipolar transistor, or a resistance element. When the heating element 30 is implemented by a MOS transistor, the MOS transistor may be an N-type transistor or a P-type transistor.

The heating element 30 includes a first heating element 31 and a second heating element 32. Specifically, the heating element 30 includes the first heating element 31, and the second heating element 32 arranged adjacent to the first heating element 31 along the Y direction with a region AR interposed therebetween. The first heating element 31 and the second heating element 32 are arranged apart from each other by a predetermined distance along the Y direction. The predetermined distance is, for example, about 20 μm. An outer shape of the first heating element 31 has a side SA1 and a side SB1. In FIG. 1, the side SA1 is a long side and the side SB1 is a short side. In addition, an outer shape of the second heating element 32 has a side SA2 and a side SB2. In FIG. 1, the side SA2 is a long side and the side SB2 is a short side. The side SB1 and the side SB2 are, for example, about 180 μm. As long as the outer shape of the first heating element 31 at least has the side SA1 and the side SA2, and the outer shape of the second heating element 32 at least has the side SB1 and the side SB2, the outer shapes of the first heating element 31 and the second heating element 32 may be a polygonal outer shape other than a rectangle. In FIG. 1, the side SA1 of the heating element 30 is along the X direction, and the side SB1 is along the Y direction. In addition, in FIG. 1, the side SA2 of the heating element 30 is along the X direction, and the side SB2 is along the Y direction.

The temperature sensor 40 is a sensor circuit that detects a temperature. Specifically, the temperature sensor 40 outputs, as a temperature detection voltage, a temperature-dependent voltage that changes according to a temperature of the environment. For example, the temperature sensor 40 uses a circuit element having a temperature dependence to generate the temperature detection voltage. Specifically, the temperature sensor 40 outputs the temperature detection voltage, whose voltage value changes depending on a temperature, by using a temperature dependence of a forward voltage of a PN junction. For example, a voltage between a base and an emitter of a bipolar transistor can be used as the forward voltage of the PN junction. When a digital temperature compensation process is performed, the temperature sensor 40 measures a temperature such as an ambient temperature and outputs a measurement result as temperature detection data.

The temperature sensor 40 is provided to detect a temperature of the first heating element 31, the second heating element 32, and the surroundings thereof. The temperature sensor 40 is arranged at an arrangement position where a position in the X direction is a position between a center of the region AR and the second side SD2, and a position in the Y direction is a position between the first heating element 31 and the second heating element 32. For example, it is assumed that an X coordinate of the arrangement position of the temperature sensor 40 is XT, an X coordinate of the center of the region AR is XC, and an X coordinate of the second side SD2 is XS. In this case, for example, a relational expression of XC<XT<XS is established. In addition, it is assumed that a Y coordinate of the arrangement position of the temperature sensor 40 is YT, a Y coordinate of an opposite side of the side SA1 of the first heating element 31 is Y1, and a Y coordinate of an opposite side of the side SA2 of the second heating element 32 is Y2. In this case, for example, a relational expression of Y2<YT<Y1 is established.

The region AR is a region existing between the first heating element 31 and the second heating element 32. Specifically, the region AR is a region surrounded by a first region side ASD1, a second region side ASD2, the opposite side of the side SA1 of the first heating element 31, and the opposite side of the side SA2 of the second heating element 32. The center of the region AR is, for example, a position where a center line of the first region side ASD1 and the second region side ASD2 passes, and may be substantially the center of the region AR. The first region side ASD1 is a region side of an outer shape of the region AR, and is a side, in region sides parallel to the Y direction, which has a shortest distance to a side of the integrated circuit device 20 facing thereto. The second region side ASD2 is an opposite side of the first region side ASD1 in the outer shape of the region AR.

Figure 2:
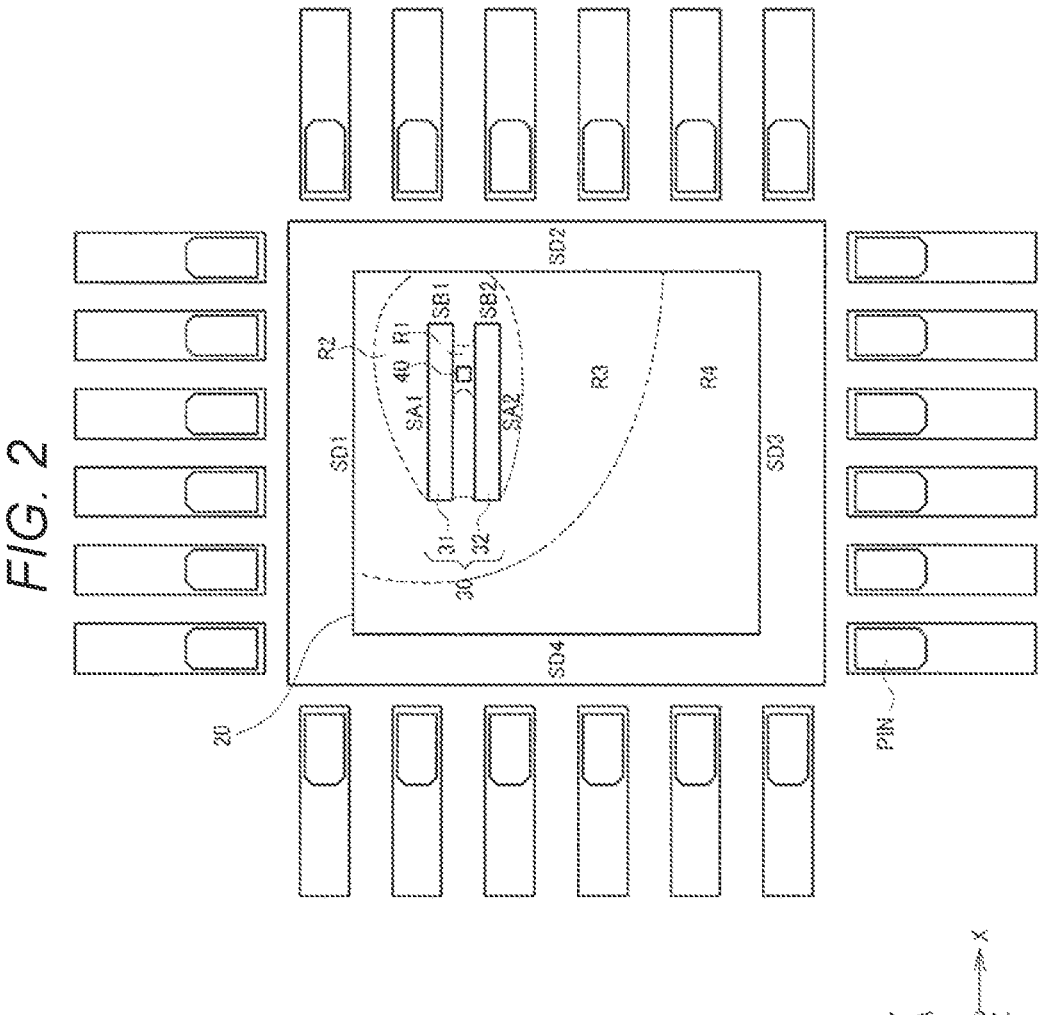
FIG. 2 is a schematic diagram showing heat distribution in a plane of the integrated circuit device.

FIG. 2 shows heat distribution in an XY plane after the heating element 30 starts to generate heat when an arrangement according to the present embodiment is adopted. In FIG. 2, heat distribution when a certain period of time has elapsed from when the heating element 30 starts to release heat is simulated and regions are displayed as R1, R2, R3, and R4 in order from a region where the temperature is the highest. As shown in FIG. 2, R1 where the temperature is the highest is at a position closer to the second side SD2 than is the center of the region AR. Therefore, as shown in the first configuration example in FIG. 1, by arranging the temperature sensor 40 at a position closer to the second side SD2 than is the center of the region AR in the X direction, it is possible to reliably detect an overheated state of the heating element 30.

Here, in order to quickly detect the overheated state, it is necessary to consider a temporal change at a position where a temperature is the highest in the integrated circuit device 20. A position where a temperature firstly becomes the highest after the start of heat generation appears in the center of the region AR. There is a mold resin on the outside of the second side SD2 and there is nowhere for heat to escape, and therefore, when a certain period of time has elapsed, the position where the temperature is the highest extends from the center of the region AR to the second side SD2 in the X direction. Therefore, by limiting the X coordinate of the arrangement position of the temperature sensor 40 from the center of the region AR to the first region side ASD1, the overheated state of the heating element 30 can be quickly detected.

Figure 3:
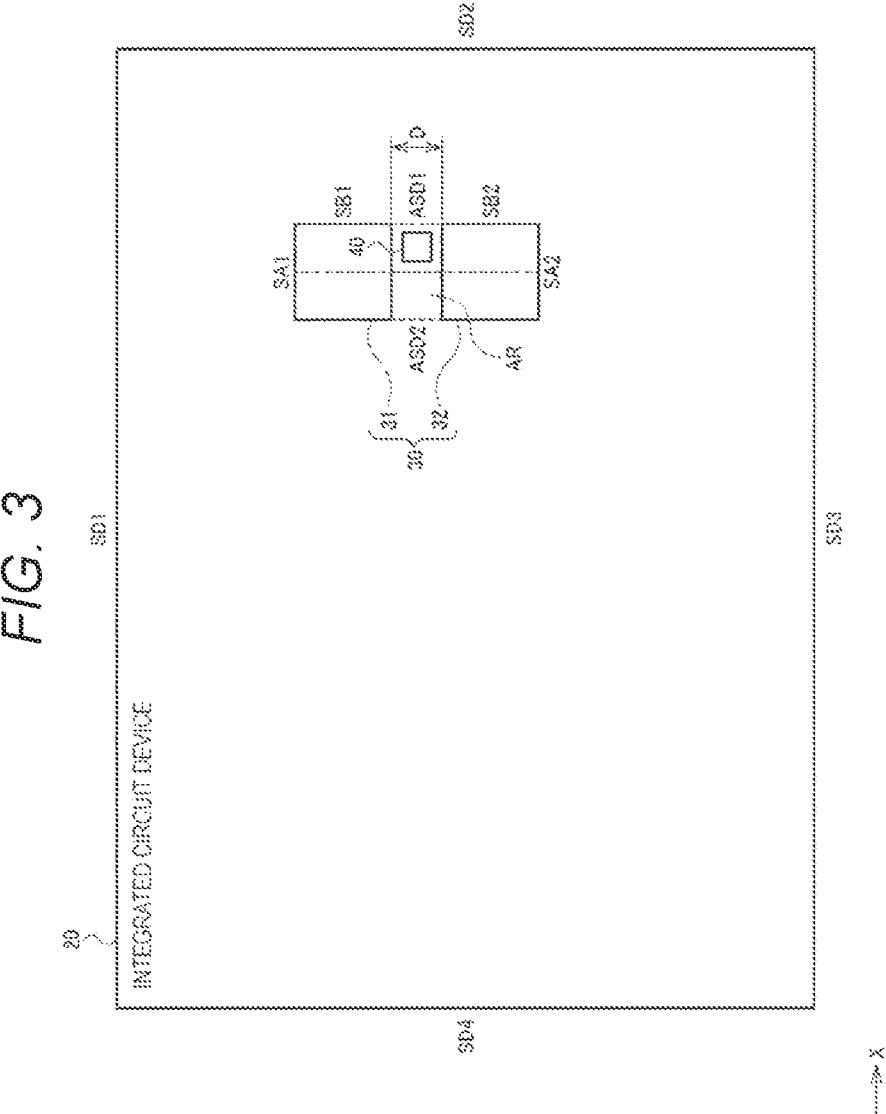
FIG. 3 shows another basic configuration example of the integrated circuit device according to the present embodiment.

As one of the basic configuration examples in FIG. 1, FIG. 3 shows a case where the outer shape of the first heating element 31 in the plan view is a square whose side SA1 and side SB1 have the same length, and the outer shape of the second heating element 32 in the plan view is a square whose side SA2 and side SB2 have the same length. One of the outer shapes of the first heating element 31 and the second heating element 32 may be a square, the other one may be a rectangle other than a square.

2. Detailed Configuration Example of Integrated Circuit Device

Figure 4:
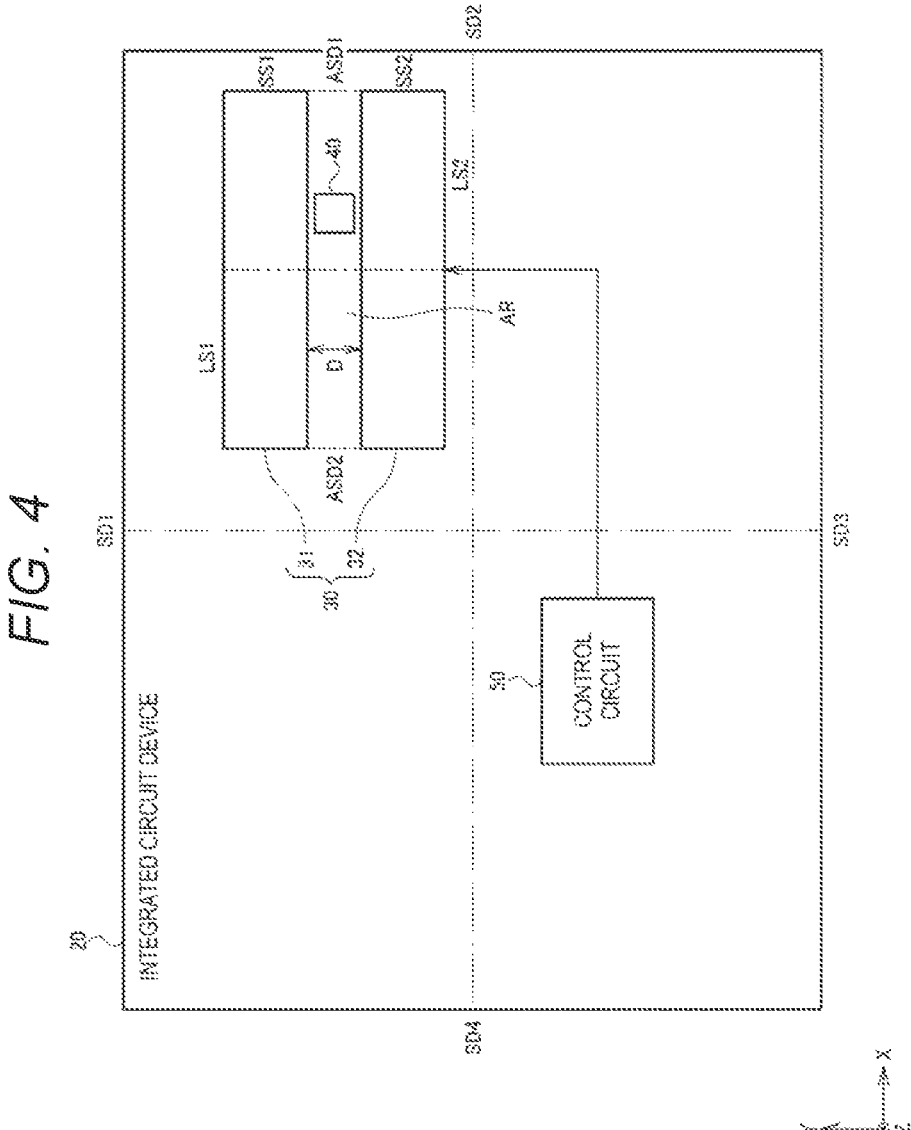
FIG. 4 shows a detailed first configuration example of the integrated circuit device.

FIG. 4 shows a detailed first configuration example of the integrated circuit device 20. In FIG. 4, the integrated circuit device 20 includes the heating element 30, the temperature sensor 40 that detects a temperature of the heating element 30, and a control circuit 50.

Similar to the basic configuration examples described with reference to FIG. 1 and FIG. 3, the heating element 30 includes the first heating element 31 and the second heating element 32. The heating element 30 includes the first heating element 31, and the second heating element 32 arranged adjacent to the first heating element 31 along the Y direction with the region AR interposed therebetween. The first heating element 31 and the second heating element 32 are arranged apart from each other by a predetermined distance along the Y direction. An outer shape of the first heating element 31 has a long side LS1 and a short side SS1. In addition, an outer shape of the second heating element 32 has a long side LS2 and a short side SS2. Similar to the basic configuration examples described with reference to FIG. 1 and FIG. 3, as long as each of the outer shapes of the first heating element 31 and the second heating element 32 at least has a long side and a short side, the outer shapes of the first heating element 31 and the second heating element 32 may be a polygonal outer shape other than a rectangle.

The first heating element 31 and the second heating element 32 are electrically coupled in parallel, and currents flowing through the first heating element 31 and the second heating element 32 that are coupled in parallel are controlled by an output signal of the control circuit 50. For example, since a first current flows through the first heating element 31 and a second current flows through the second heating element 32, a current obtained by adding the first current and the second current flows through the heating element 30.

The arrangement position of the temperature sensor 40 is the same as that in the basic configuration example described with reference to FIG. 1. That is, the temperature sensor 40 is arranged at an arrangement position where a position in the X direction is a position between the center of the region AR and the second side SD2, and a position in the Y direction is a position between the first heating element 31 and the second heating element 32.

The control circuit 50 is a circuit that controls flow of a current through the heating element 30. The control circuit 50 is implemented by, for example, a logic circuit. For example, when the heating element 30 is a MOS transistor, the control circuit 50 controls a current flowing through the MOS transistor which is the heating element 30 by controlling a gate of the MOS transistor. In addition, when the heating element 30 is a bipolar transistor, the control circuit 50 controls collector current flowing through the bipolar transistor, for example, by controlling a voltage between a base and an emitter of the bipolar transistor. Further, when the heating element 30 is a resistance element, the control circuit 50 controls a current flowing through the resistance element by controlling a voltage applied to the resistance element or controlling a current source coupled to the resistance element.

Figure 5:
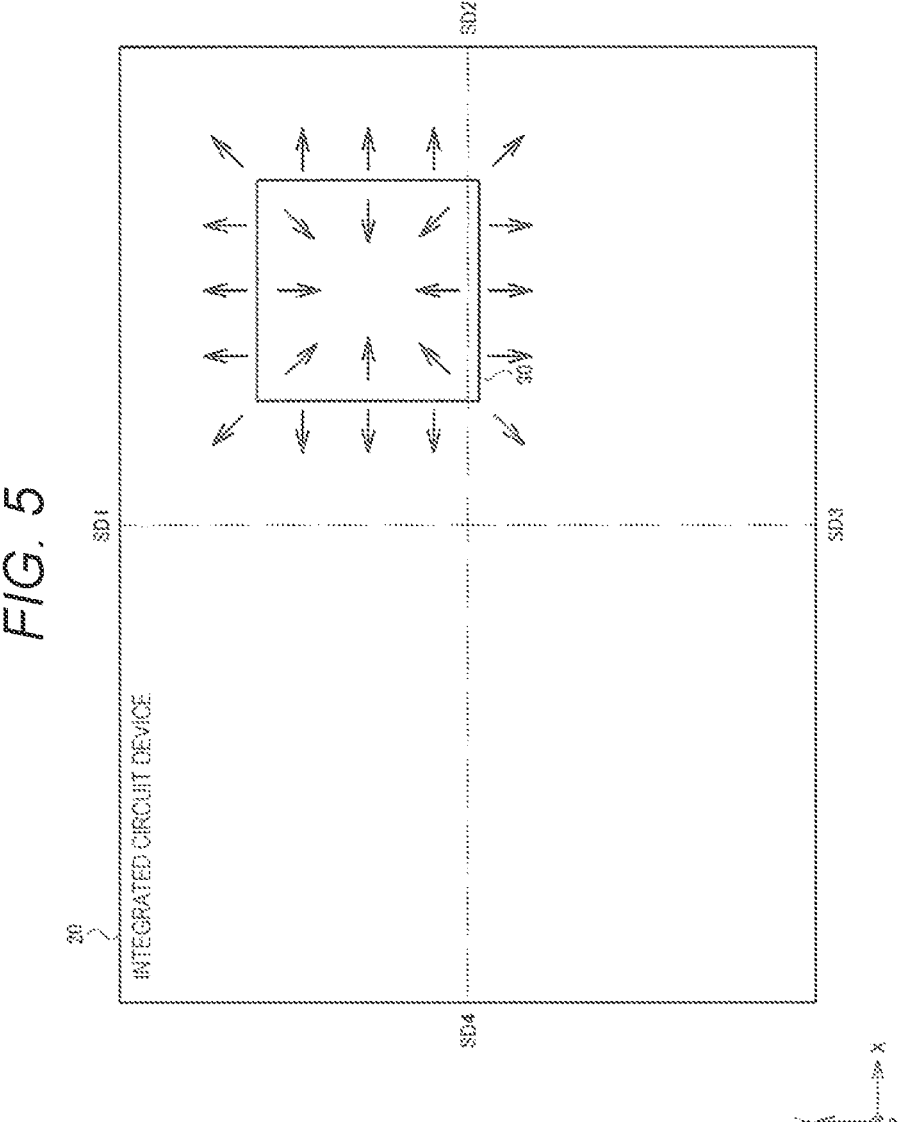
FIG. 5 is a schematic diagram showing heat diffusion in the plane of the integrated circuit device which does not adopt an arrangement according to the present embodiment.

In the first configuration example, an operation and effect obtained by setting the first heating element 31 and the second heating element 32 into rectangles respectively having long sides and short sides will be described. FIG. 5 is a schematic diagram showing, with arrows, diffusion of heat when the outer shape of the heating element 30 is a square in a simplified structure in which the heating element 30 is not divided into the first heating element 31 and the second heating element 32. Considering a relationship between the outer shape of the heating element 30 and the heat released from the heating element 30, regarding an area of the heating element 30 in a plan view, the longer an outer periphery of the outer shape of the heating element 30 in the plan view is, the larger an area in which the heating element 30 is in contact with the outside is. Specifically, when there are the heating elements 30 having the same area in the plan view, an outer periphery of the outer shape thereof increases and an area in which the heating element 30 is in contact with the outside also increases in an order of the outer shape of a circle, a square, and a rectangle. That is, considering the heating elements 30 having the same area in the plan view, heat dissipation of heat to the outside is improved in the order of a circle, a square, and a rectangle. Generally, an outer shape of a region of an element formed at a semiconductor chip in the plan view is a rectangle. Therefore, as compared with a case where the outer shape of the heating element 30 is a rectangle, when the outer shape of the heating element 30 is a square, the area in contact with the outside reduces, and heat is likely to be accumulated inside the heating element 30.

Figure 6:
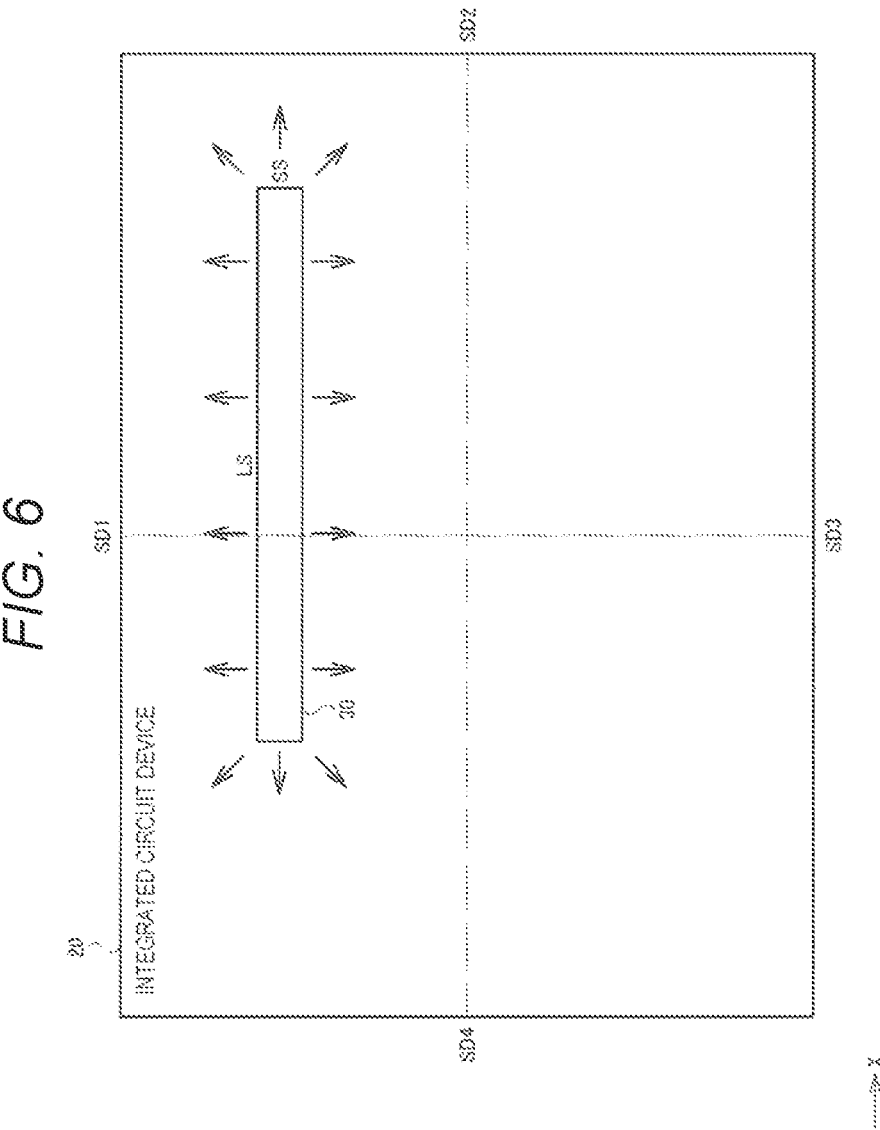
FIG. 6 is a schematic diagram showing heat diffusion in the plane of the integrated circuit device which adopts the arrangement according to the present embodiment.

For example, in an example in FIG. 5 in which the arrangement according to the present embodiment is not adopted, the outer shape of the heating element 30 in the plan view does not have a long side and a short side, and is specifically a square. In this case, as shown by the arrows shown inside the heating element 30 in FIG. 5, a part of the heat generated by the heating element 30 is accumulated inside the heating element 30. Meanwhile, in an example in FIG. 6 in which the arrangement according to the present embodiment is adopted, the outer shape of the heating element 30 has the long side LS and the short side SS, and is specifically a rectangle. Therefore, as compared with a case where the outer shape of the heating element 30 is a square as in FIG. 5, as a length of the outer periphery increases, the area in which the heating element 30 is in contact with the outside increases, and heat is easily diffused to the outside through the long side LS. Accordingly, the heat accumulated inside the heating element 30 is reduced, and a malfunction of the element caused by the overheated state can be avoided.

When a length of the long side LS is substantially at least twice a length of the short side SS, the heat dissipation of the heating element 30 is remarkably improved. Therefore, in the present embodiment, it is desirable that the length of the long side LS of the heating element 30 is at least twice the length of the short side SS.

In the above, as means for improving the heat dissipation of the heating element 30, a case has been described in which the long side is set to be longer than the short side, and desirably the long side is set to be substantially at least twice the short side. When the heating element 30 is divided into the first heating element 31 and the second heating element 32, there is also an effect of increasing the area in which the heating element 30 is in contact with the outside and improving the heat dissipation. Therefore, in order to improve the heat dissipation of the heating element 30, the heating element 30 may be divided into three or more heating parts.

Figure 7:
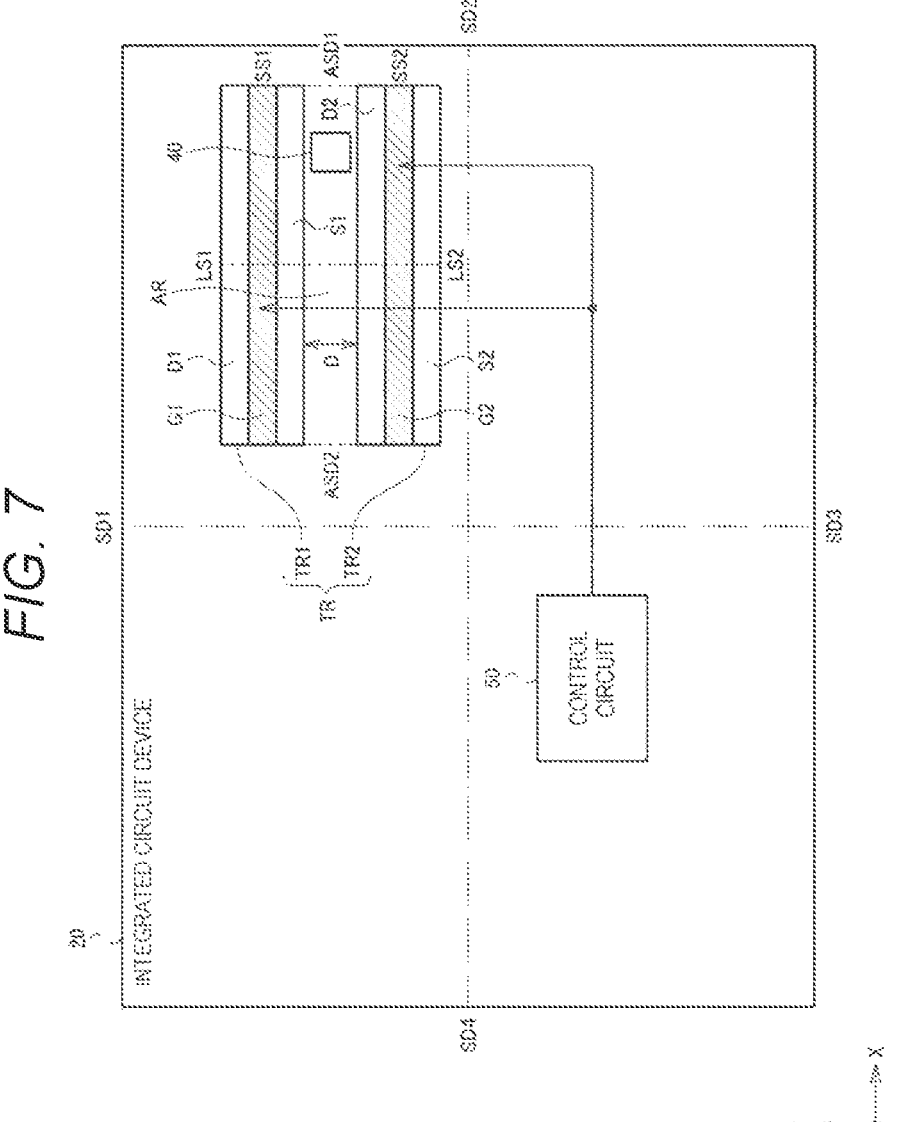
FIG. 7 shows a detailed second configuration example of the integrated circuit device.

FIG. 7 shows a detailed second configuration example of the integrated circuit device 20. The first heating element 31 and the second heating element 32 in the basic configuration example of the integrated circuit device 20 shown in FIG. 1 and the like are transistors TR in the integrated circuit device 20 shown in the second configuration example.

The transistor TR is, for example, a MOS transistor. The MOS transistor may be an N-type MOS transistor or a P-type MOS transistor. The transistor TR is controlled by the control circuit 50, and a current flows between a drain D and a source S of the transistor TR, and thus heat is generated by the current flowing in this way.

The transistor TR includes a first transistor TR1 and a second transistor TR2. Specifically, the transistor TR includes the first transistor TR1, and the second transistor TR2 arranged adjacent to the first transistor TR1 along the Y direction with the region AR interposed therebetween. The first transistor TR1 and the second transistor TR2 are arranged apart from each other by a predetermined distance along the Y direction. An outer shape of the first transistor TR1 has the long side LS1 and the short side SS1. In addition, an outer shape of the second transistor TR2 has the long side LS2 and the short side SS2. In the first transistor TR1, the long side LS1 is desirably at least twice the short side SS1. In the second transistor TR2, the long side LS2 is also desirably at least twice the short side SS2. In addition, a gate G1 of the first transistor TR1 and a gate G2 of the second transistor TR2 are arranged such that longitudinal directions thereof are, for example, along the X direction.

The first transistor TR1 and the second transistor TR2 are electrically coupled to the control circuit 50. The output signal of the control circuit 50 is input to the gate G1 of the first transistor TR1 and the gate G2 of the second transistor TR2. A source S1 of the first transistor TR1 and a source S2 of the second transistor TR2 are coupled to, for example, a ground node. A drain D1 of the first transistor TR1 and a drain D2 of the second transistor TR2 are coupled to, for example, a power supply voltage node. A well of the transistor TR is coupled to, for example, the ground node.

When a voltage of the output signal of the control circuit 50 is larger than a threshold voltage, a current flows from the drain D of the transistor TR to the source S thereof.

The first transistor TR1 and the second transistor TR2 are electrically coupled in parallel. For example, in the first transistor TR1 and the second transistor TR2, sources thereof are coupled to each other and drains thereof are coupled to each other. The first transistor TR1 and the second transistor TR2 are controlled by the output signal of the control circuit 50.

The temperature sensor 40 is provided to detect a temperature of the first transistor TR1, the second transistor TR2, and the surroundings thereof. The temperature sensor 40 is arranged at an arrangement position where a position in the X direction is a position between the center of the region AR and the second side SD2, and a position in the Y direction is a position between the first transistor TR1 and the second transistor TR2.

The region AR is a region existing between the first transistor TR1 and the second transistor TR2, and is a region surrounded by the first region side ASD1, the second region side ASD2, the opposite side of the long side LS1 of the first transistor TR1, and the opposite side of the long side LS2 of the second transistor TR2. The first region side ASD1 is a side of the outer shape of the region AR, and is a side, in sides parallel to the Y direction, which has a shortest distance to a side of the integrated circuit device 20 facing thereto. The second region side ASD2 is an opposite side of the first region side ASD1 in the outer shape of the region AR.

The heat distribution in the XY plane after the transistor TR starts to generate heat can be considered by respectively replacing the first heating element 31 and the second heating element 32 in FIG. 2 with the first transistor TR1 and the second transistor TR2. That is, in the second configuration example, in order to detect an overheated state of the transistor TR, it is necessary to arrange the temperature sensor 40 at least at a position closer to the second side SD2 than is the center of the region AR in the X direction, and in order to quickly detect the overheated state of the transistor TR, it is desirable to arrange the temperature sensor 40 between a center of the long side LS in the X direction and the first region side ASD1 in the region AR.

The transistor TR is used, for example, for charging or discharging a load 300 described later. Thus, it is assumed that an amount of a current flowing through the transistor TR is large and an amount of heat generated accompanying the same is also large. Therefore, when the transistor TR is provided as the heating element 30, occurrence of heat bias inside the integrated circuit device 20 can be prevented by setting a shape of the transistor TR as in the second configuration example.

Figure 8:
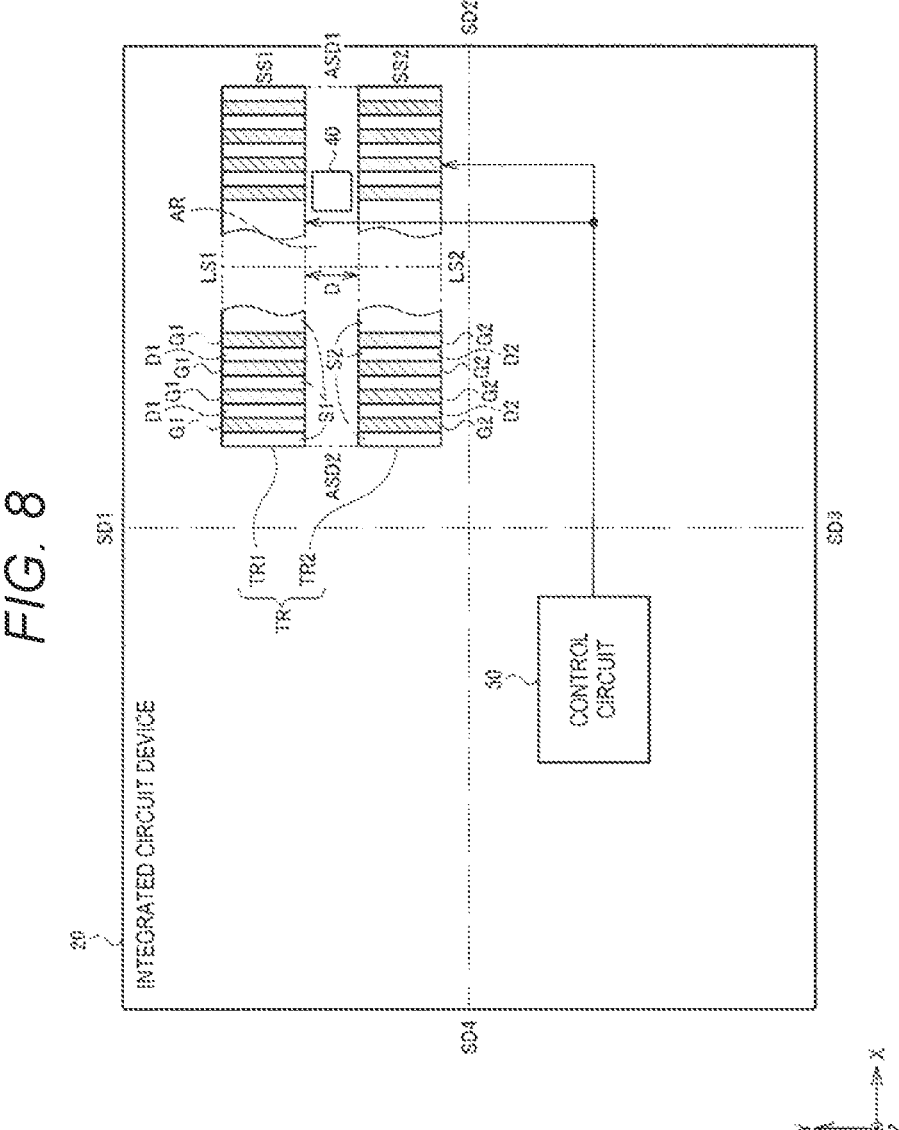
FIG. 8 shows a detailed third configuration example of the integrated circuit device.

FIG. 8 shows a detailed third configuration example of the integrated circuit device 20. Each of the first transistor TR1 and the second transistor TR2 in the second configuration example includes a plurality of unit transistors in the integrated circuit device 20 according to the third configuration example.

For example, the first transistor TR1 includes a plurality of unit transistors provided in parallel between a drain and a source. Further, for example, the plurality of unit transistors are arranged adjacently in the X direction such that a longitudinal direction of the gate G of each unit transistor is parallel to the Y direction. In this case, a source of each unit transistor is the source S common to a source of an adjacent unit transistor. In addition, a drain of each unit transistor is also the drain D common to a drain of an adjacent unit transistor. An arrangement and a configuration of the unit transistors are not limited thereto.

As described above, in the integrated circuit device 20, as compared with the case in FIG. 5 in which the outer shape of the heating element 30 is a square, when the outer shape of the heating element 30 in the plan view is a rectangle, since the length of the outer periphery of the heating element 30 is longer, the heat dissipation of the heating element 30 can be improved. This effect is also similarly obtained in the second configuration example in FIG. 7 and the third configuration example in FIG. 8.

By configuring the transistor TR with a plurality of unit transistors as in the third configuration example in FIG. 8, the amount of current of the transistor TR per same area can be increased as compared with the second configuration example in FIG. 7. That is, a current supply capability can be improved. When the amount of current is increased in this way, the amount of heat generated per same area is also increased. Therefore, when the transistor TR includes a plurality of unit transistors, by setting arrangement directions and shapes of the unit transistors as in the third configuration example, occurrence of heat bias inside the integrated circuit device 20 can be effectively prevented. Further, by configuring the transistor TR with a plurality of unit transistors, a width W of a gate of each unit transistor can be reduced, and reliability can be improved.

Figure 9:
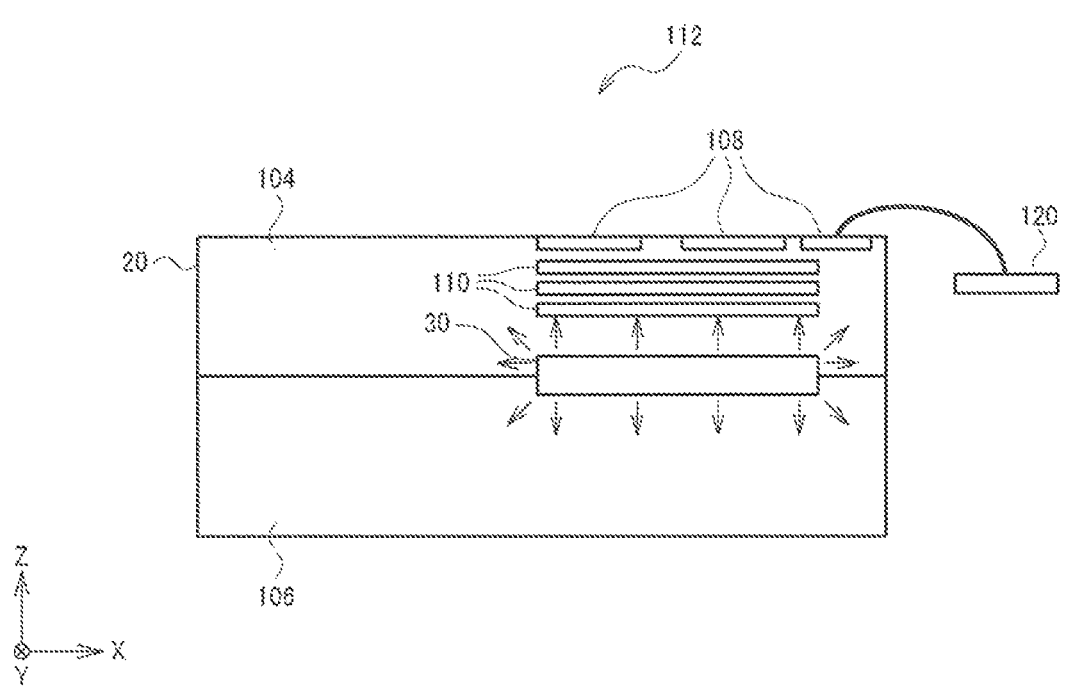
FIG. 9 shows a detailed fourth configuration example of the integrated circuit device.

FIG. 9 shows a detailed fourth configuration example of the integrated circuit device 20. In the integrated circuit device 20 of the fourth configuration example, in the integrated circuit devices 20 of the first configuration example to the third configuration example, a dummy metal wiring or a dummy pad is provided at an upper layer of the heating element 30 or the transistor TR. 120 in FIG. 9 represents a terminal and corresponds to a PIN in FIG. 2.

A metal wiring 110 is provided as a dummy. The metal wiring 110 can be implemented by, for example, a metal such as aluminum or an aluminum alloy, but is not limited thereto. The metal wiring 110 is implemented by a method of forming a wiring pattern by etching after forming a solid metal film, or a method of embedding a metal after processing a base of a wiring pattern. The metal wiring 110 may be one used for actual circuit driving or the like.

A pad 108 is provided as a dummy. The pad 108 can be implemented by, for example, a metal such as aluminum or an aluminum alloy, but is not limited thereto. The pad 108 is implemented by a method of forming a wiring pattern by etching after forming a solid metal film, or a method of embedding a metal after processing a base of a wiring pattern. The pad 108 may be one used for actual circuit driving or the like.

FIG. 9 is a schematic diagram of, for example, the integrated circuit device 20 in FIG. 1 as viewed from a cross section of an X-Z plane. In a +Z direction viewed from the heating element 30, there are a metal wiring, polycrystalline silicon doped with impurities, and an insulating film such as a silicon oxide. In a −Z direction viewed from the heating element 30, there is basically single crystal silicon doped with impurities.

Figure 10:
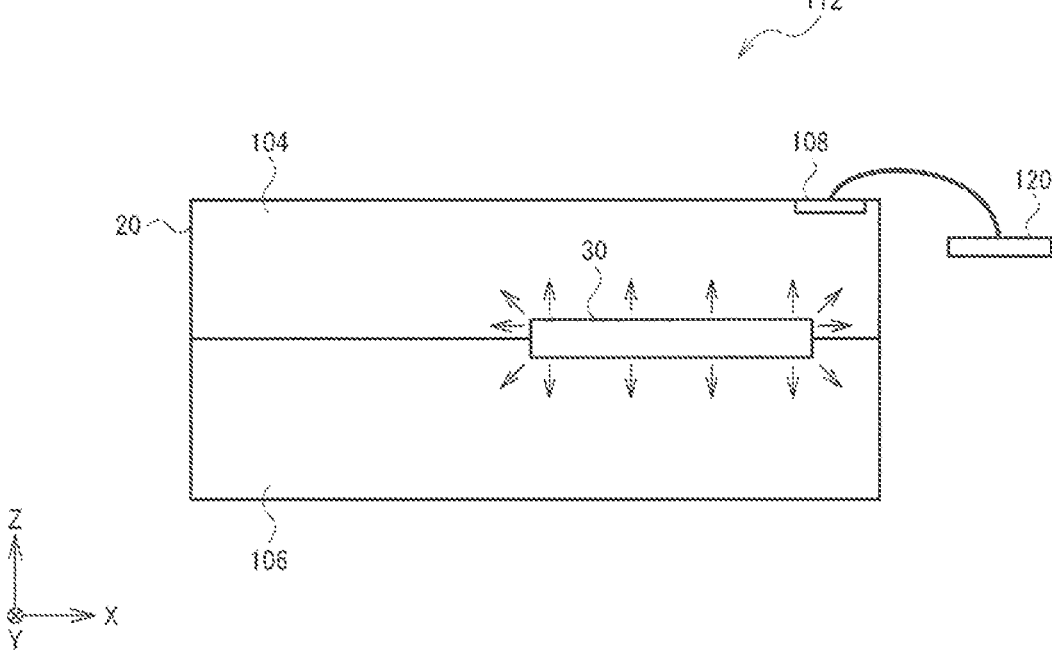
FIG. 10 shows a configuration example as a comparative example of the fourth configuration example.

Since the insulating film such as a silicon oxide in the +Z direction viewed from the heating element 30 generally has lower thermal conductivity than the metal wiring and the polycrystalline silicon, heat from the heating element 30 or the transistor TR is accumulated in a structure in which there is no metal wiring in the +Z direction as shown in FIG. 10, which shows a comparative example of the fourth configuration example. Therefore, as in the fourth configuration example shown in FIG. 9, by arranging a metal wiring or a pad having high thermal conductivity, a situation where the heat is accumulated in the +Z direction can be solved.

Figure 11:
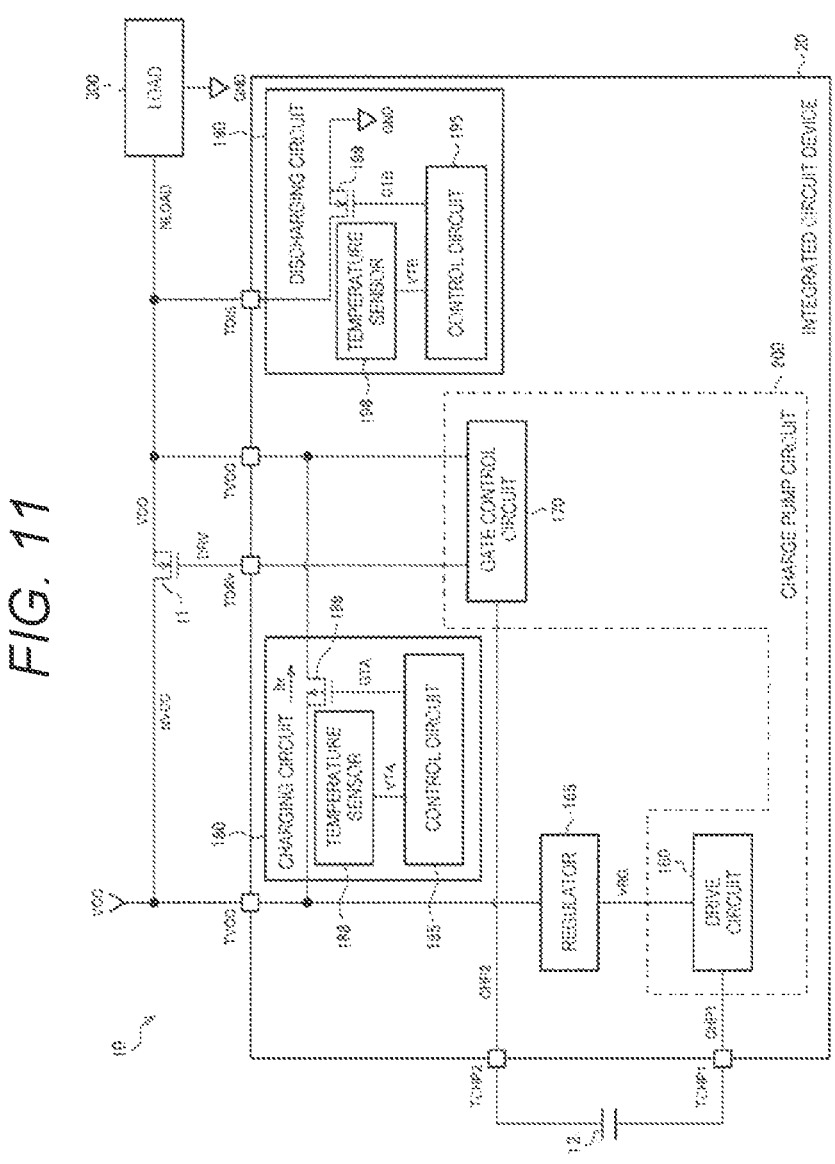
FIG. 11 shows a specific circuit configuration example of the integrated circuit device and an electronic device.

FIG. 11 is a diagram showing a specific circuit configuration example of the integrated circuit device 20 and an electronic device 10 including the integrated circuit device 20. The electronic device 10 includes an external transistor 11, the load 300, and the integrated circuit device 20. Hereinafter, an example in which the external transistor 11 is an N-type transistor will be mainly described, but the present disclosure is not limited thereto, and the external transistor 11 may be a P-type transistor.

The electronic device 10 may be, for example, a printing device, a video projection device, a wearable device, an information processing device, a display device, a television receiver, a portable information terminal, or the like, but is not limited thereto, and may be various devices using a direct-current power supply voltage VCC.

The external transistor 11 is provided between a power supply node NVCC and the load 300. Specifically, a drain of the external transistor 11 is coupled to the power supply node NVCC, and a source is coupled to a node NLOAD of the load 300. The external transistor 11 is a so-called power transistor, supplies the power supply voltage VCC to the load 300 when the external transistor 11 is on, and cuts off the supply of the power supply voltage VCC to the load 300 when the external transistor 11 is off.

The power supply voltage VCC is supplied to the power supply node NVCC from a direct current power supply. The direct current power supply is, for example, an AC-DC converter, a DC-DC converter or a battery. Although not shown in FIG. 11, these direct current power supplies may be provided in the electronic device 10.

The load 300 is a circuit operated by the power supply voltage VCC supplied to the node NLOAD via the external transistor 11. The node NLOAD is a power supply node of the load 300. The load 300 is, for example, a power supply stabilizing capacitor provided between the node NLOAD and a ground voltage GND, a processing device that executes processing in the electronic device 10, or a motor driver that drives a motor. The load 300 is not limited thereto, and may be a circuit that realizes various functions in the electronic device 10.

The integrated circuit device 20 controls the supply of the power supply voltage VCC to the load 300 by outputting a gate control voltage DRV to a gate of the external transistor 11. The integrated circuit device 20 includes a regulator 165, a charge pump circuit 200, a charging circuit 180, a discharging circuit 190, and terminals TCHP1, TCHP2, TVCC, TDRV, TVCO, and TDIS. The integrated circuit device 20 is, for example, an integrated circuit device in which a plurality of circuit elements are integrated on a semiconductor substrate. Each terminal is, for example, a pad of the integrated circuit device or a terminal of a package for accommodating the integrated circuit device.

The regulator 165 regulates the power supply voltage VCC from the power supply node NVCC to output a regulated voltage VRG. The terminal TVCC is coupled to the power supply node NVCC, and the power supply voltage VCC is supplied to the regulator 165 via the terminal TVCC. The regulator 165 is a buck regulator that outputs the regulated voltage VRG lower than the power supply voltage VCC. The regulator 165 is, for example, a linear regulator, but is not limited thereto, and may be various types of DC-DC converters.

The charge pump circuit 200 outputs a gate control voltage DRV=VCO+VRG higher than a source voltage VCO by boosting a voltage based on the regulated voltage VRG with reference to the source voltage VCO of the external transistor 11. Accordingly, when the charge pump circuit 200 is operating, since the external transistor 11 is turned on, the power supply voltage VCC is supplied to the load 300 via the external transistor 11.

Specifically, one end of a boosting capacitor 12 is coupled to the terminal TCHP1, the other end of the boosting capacitor 12 is coupled to the terminal TCHP2, and the gate of the external transistor 11 is coupled to the terminal TDRV. The charge pump circuit 200 includes a drive circuit 160 and a gate control circuit 170. The drive circuit 160 outputs a drive signal CHP1 to the one end of the boosting capacitor 12 based on the regulated voltage VRG. A signal CHP2 from the other end of the boosting capacitor 12 is input to the gate control circuit 170. The gate control circuit 170 outputs the gate control voltage DRV=VCO+VRG based on the signal CHP2 and the source voltage VCO of the external transistor 11. The gate control voltage DRV is output to the gate of the external transistor 11 via the terminal TDRV.

When the external transistor 11 is a P-type transistor, the source voltage of the external transistor 11 is the power supply voltage VCC. The charge pump circuit 200 may output a gate control voltage DRV=VCC−VRG lower than the power supply voltage VCC by reducing a voltage based on the regulated voltage VRG with reference to the power supply voltage VCC.

A transistor 189 is provided between the power supply node NVCC and the node NLOAD. Specifically, the transistor 189 is a P-type transistor, a source thereof is coupled to the terminal TVCC and a drain thereof is coupled to the terminal TVCO. The terminal TVCO is a terminal coupled to the source of the external transistor 11 and the node NLOAD. Although FIG. 11 shows an example in which the transistor 189 is a P-type transistor, the transistor 189 may be an N-type transistor. Further, the transistor 189 in FIG. 11 corresponds to a charging transistor TRC in FIG. 12 and FIG. 13 described later.

A temperature sensor 188 detects a temperature of the transistor 189 and outputs a temperature detection voltage VTA whose voltage value changes according to the detected temperature. The temperature sensor 188 is arranged in the vicinity of the transistor 189 such that the temperature of the transistor 189 can be detected. The temperature sensor 188 is, for example, a temperature sensor using a temperature dependence of a forward voltage of a PN junction, but is not limited thereto, and may be various types of temperature sensors.

A control circuit 185 controls a transistor current by controlling a gate voltage GTA of the transistor 189. A transistor current in the charging circuit 180 is a current flowing through the transistor 189. The control circuit 185 controls the transistor current based on the temperature detection voltage VTA to avoid a failure caused by heat generation of the transistor 189. Further, the control circuit 185 performs control such that the transistor current flows as much as possible within a range in which the transistor 189 can be maintained at an allowable temperature or lower.

The discharging circuit 190 discharges a capacitor of the node NLOAD of the load 300 after the external transistor 11 is turned off. Accordingly, after the external transistor 11 is turned off, a malfunction caused by a voltage held in the capacitor of the node NLOAD or charges accumulated in the capacitor of the node NLOAD can be prevented. The discharging circuit 190 includes a transistor 199, a temperature sensor 198, and a control circuit 195.

The transistor 199 is provided between the node NLOAD and a ground node. Specifically, the transistor 199 is an N-type transistor, a source thereof is coupled to the ground node and a drain thereof is coupled to the terminal TDIS. The terminal TDIS is a terminal coupled to the node NLOAD of the load 300. The transistor 199 in FIG. 11 corresponds to a discharging transistor TRD in FIG. 12 and FIG. 13 described later.

The temperature sensor 198 detects a temperature of the transistor 199 and outputs a temperature detection voltage VTB whose voltage value changes according to the detected temperature. The temperature sensor 198 is arranged in the vicinity of the transistor 199 such that the temperature of the transistor 199 can be detected. The temperature sensor 198 is, for example, a temperature sensor using a temperature dependence of a forward voltage of a PN junction, but is not limited thereto, and may be various types of temperature sensors. The temperature sensors 188 and 198 in FIG. 11 correspond to the temperature sensor 40 in FIGS. 1, 2, 3, 4, 7 and 8, a first temperature sensor 41 and a second temperature sensor 42 in FIGS. 12 and 13 described later.

The control circuit 195 controls a transistor current by controlling a gate voltage GTB of the transistor 199. A transistor current in the discharging circuit 190 is a current flowing through the transistor 199. The control circuit 195 controls the transistor current based on the temperature detection voltage VTB to avoid a failure caused by heat generation of the transistor 199. Further, the control circuit 195 performs control such that the transistor current flows as much as possible within a range in which the transistor 199 can be maintained at an allowable temperature or lower. The details of this control will be described later. The control circuits 185 and 195 in FIG. 11 correspond to the control circuit 50 in FIGS. 4, 7 and 8, and FIGS. 12 and 13 described later.

Figure 12:
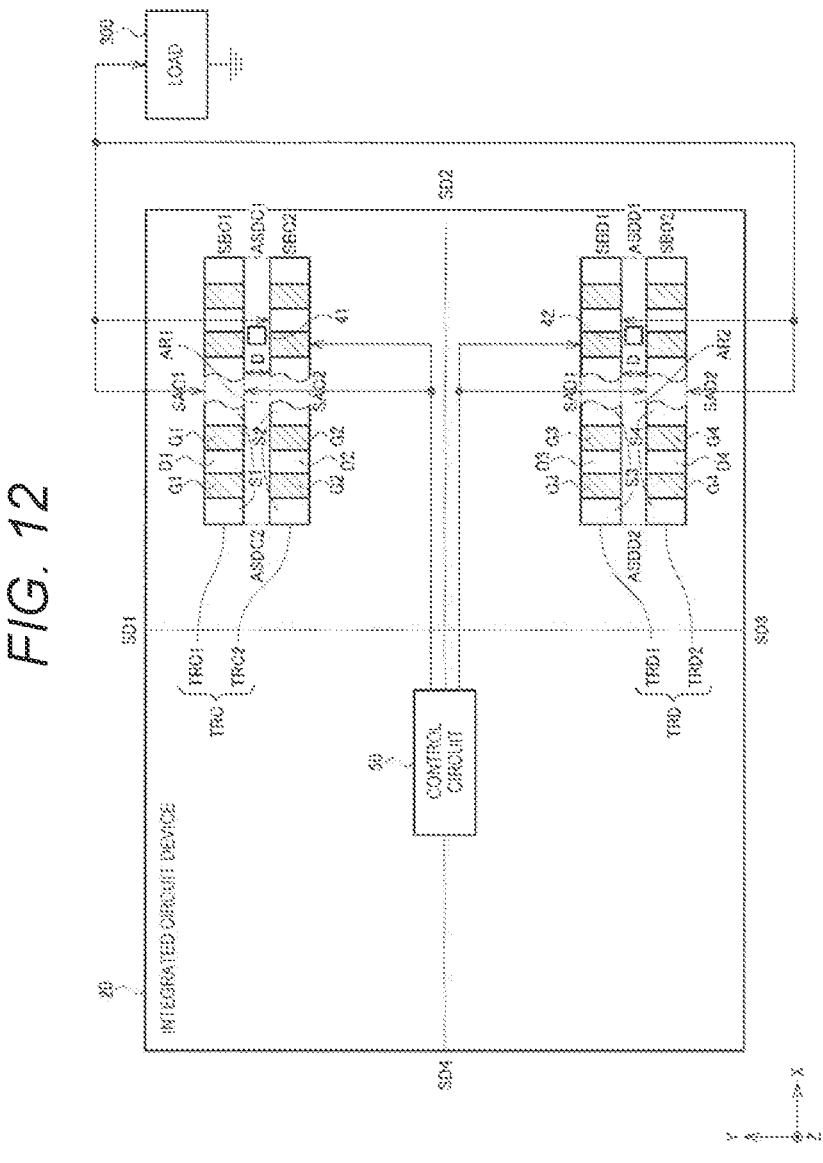
FIG. 12 shows a detailed fifth configuration example of the integrated circuit device.

FIG. 12 shows a detailed fifth configuration example of the integrated circuit device 20. FIG. 12 corresponds to the configuration example in FIG. 11. The integrated circuit device 20 includes the charging transistor TRC, the discharging transistor TRD, the first temperature sensor 41, the second temperature sensor 42, and the control circuit 50.

A current for charging the load 300 flows through, for example, the charging transistor TRC. Heat is generated by the current flowing through the charging transistor TRC. The charging transistor TRC includes a first charging transistor TRC1 and a second charging transistor TRC2.

Specifically, the charging transistor TRC includes the first charging transistor TRC1, and the second charging transistor TRC2 arranged adjacent to the first charging transistor TRC1 along the Y direction with a first region AR1 interposed therebetween. The first charging transistor TRC1 and the second charging transistor TRC2 are arranged apart from each other by a predetermined distance along the Y direction. An outer shape of the first charging transistor TRC1 has a side SAC1 and a side SBC1. In addition, an outer shape of the second charging transistor TRC2 has a side SAC2 and a side SBC2.

The first charging transistor TRC1 and the second charging transistor TRC2 are implemented by, for example, P-type MOS transistors or N-type MOS transistors. The first charging transistor TRC1 includes a plurality of unit transistors arranged such that a longitudinal direction of a gate G1 of each unit transistor is, for example, a direction along the Y direction, and the second charging transistor TRC2 includes a plurality of unit transistors arranged such that a longitudinal direction of a gate G2 of each unit transistor is, for example, a direction along the Y direction.

The first charging transistor TRC1 and the second charging transistor TRC2 are electrically coupled in parallel, for example. The output signal of the control circuit 50 is input to the gate G1 of the first charging transistor TRC1 and the gate G2 of the second charging transistor TRC2. A source S1 of the first charging transistor TRC1 and a source S2 of the second charging transistor TRC2 are coupled to, for example, a ground node. A drain D1 of the first charging transistor TRC1 and a drain D2 of the second charging transistor TRC2 are coupled to, for example, a power supply voltage node.

A current for discharging the load 300 flows through, for example, the discharging transistor TRD. Heat is generated by the current flowing through the discharging transistor TRD. The discharging transistor TRD includes a first discharging transistor TRD1 and a second discharging transistor TRD2.

Specifically, the discharging transistor TRD includes the first discharging transistor TRD1, and the second discharging transistor TRD2 arranged adjacent to the first discharging transistor TRD1 along the Y direction with a second region AR2 interposed therebetween. The first discharging transistor TRD1 and the second discharging transistor TRD2 are arranged apart from each other by a predetermined distance along the Y direction. An outer shape of the first discharging transistor TRD1 has a side SAD1 and a side SBD1. In addition, an outer shape of the second discharging transistor TRD2 has a side SAD2 and a side SBD2.

The first discharging transistor TRD1 and the second discharging transistor TRD2 are implemented by, for example, P-type MOS transistors or N-type MOS transistors. The first discharging transistor TRD1 includes a plurality of unit transistors arranged such that a longitudinal direction of a gate G3 of each unit transistor is, for example, a direction along the Y direction, and the second discharging transistor TRD2 includes a plurality of unit transistors arranged such that a longitudinal direction of a gate G4 of each unit transistor is, for example, a direction along the Y direction.

The first discharging transistor TRD1 and the second discharging transistor TRD2 are electrically coupled in parallel, for example. The output signal of the control circuit 50 is input to the gate G3 of the first discharging transistor TRD1 and the gate G4 of the second discharging transistor TRD2. A source S3 of the first discharging transistor TRD1 and a source S4 of the second discharging transistor TRD2 are coupled to, for example, a ground node. A drain D3 of the first discharging transistor TRD1 and a drain D4 of the second discharging transistor TRD2 are coupled to, for example, a power supply voltage node.

The first temperature sensor 41 and the second temperature sensor 42 correspond to the temperature sensor 40 shown in FIGS. 1 to 4, FIGS. 7 and 8, and are sensor circuits that detect a temperature. The first temperature sensor 41 is provided to detect a temperature of the first charging transistor TRC1, the second charging transistor TRC2, and the surroundings thereof.

The first temperature sensor 41 is arranged at an arrangement position where a position in the X direction is a position between a center of the first region AR1 and the second side SD2, and a position in the Y direction is a position between the first charging transistor TRC1 and the second charging transistor TRC2.

Specifically, an outer shape of the first region AR1 between the first charging transistor TRC1 and the second charging transistor TRC2 has a first region side ASDC1 close to the second side SD2 and a second region side ASDC2 farther from the second side SD2 than is the first region side ASDC1. The first temperature sensor 41 is arranged between the center of the first region AR1 and the first region side ASDC1.

Here, the first region AR1 is a region existing between the first charging transistor TRC1 and the second charging transistor TRC2. The first region side ASDC1 is a side of the outer shape of the first region AR1, and is a side, in sides parallel to the Y direction, which has a shortest distance to a side of the integrated circuit device 20 facing thereto. The second region side ASDC2 is an opposite side of the first region side ASDC1 in the outer shape of the first region AR1.

The second temperature sensor 42 is provided to detect a temperature of the first discharging transistor TRD1, the second discharging transistor TRD2, and the surroundings thereof. The second temperature sensor 42 is arranged at an arrangement position where a position in the X direction is a position between a center of the second region AR2 and the second side SD2, and a position in the Y direction is a position between the first discharging transistor TRD1 and the second discharging transistor TRD2.

Specifically, an outer shape of the second region AR2 between the first discharging transistor TRD1 and the second discharging transistor TRD2 has a third region side ASDD1 close to the second side SD2 and a fourth region side ASDD2 farther from the second side SD2 than is the third region side ASDD1. The second temperature sensor 42 is arranged between the center of the second region AR2 and the third region side ASDD1.

Here, the second region AR2 is a region existing between the first discharging transistor TRD1 and the second discharging transistor TRD2. The third region side ASDD1 is a side of the outer shape of the second region AR2, and is a side, in sides parallel to the Y direction, which has a shortest distance to a side of the integrated circuit device 20 facing thereto. The fourth region side ASDD2 is an opposite side of the third region side ASDD1 in the outer shape of the second region AR2.

The control circuit 50 is a circuit that controls a current flowing through, for example, the charging transistor TRC and the discharging transistor TRD. The control circuit 50 is implemented by, for example, a logic circuit. The control circuit 50 controls the current flowing through the charging transistor TRC and the discharging transistor TRD by controlling gates of the charging transistor TRC and the discharging transistor TRD which are MOS transistors.

A position where the temperature is the highest in the charging transistor TRC and the discharging transistor TRD is the same as in the case of the basic configuration example of the integrated circuit device 20. That is, in the charging transistor TRC, a position where the temperature is the highest appears in the center of the first region AR1 after the start of heat generation, and extends from the center of the first region AR1 to the second side SD2 with the elapse of time. Therefore, by arranging a position of the first temperature sensor 41 in the X direction between the center of the first region AR1 and the second side, the overheated state can be reliably detected.

In addition, if the position of the first temperature sensor 41 in the X direction is limited to a region from the center of the first region AR1 to the first region side ASDC1, it is possible to detect the overheated state at an early stage, and avoid a decrease in the capacity or a malfunction of a peripheral element including the charging transistor TRC.

Similarly, in the discharging transistor TRD, by arranging a position of the second temperature sensor 42 in the X direction between the center of the second region AR2 and the second side SD2, the overheated state can be reliably detected. In addition, if the position of the second temperature sensor 42 in the X direction is limited to a region from the center of the second region AR2 to the third region side ASDD1, it is possible to detect the overheated state at an early stage, and avoid a decrease in the capacity or a malfunction of a peripheral element including the discharging transistor TRD.

In addition, as shown in FIG. 12, the outer shape of the integrated circuit device 20 has the first side SD1 and the third side SD3 which is the opposite side of the first side SD1, and the charging transistor TRC is arranged between the first side SD1 and a center line of the first side SD1 and the third side SD3. The discharging transistor TRD is arranged between the third side SD3 and the center line. For example, in FIG. 12, the center line of the first side SD1 and the third side SD3 is represented by a dotted line along the X direction. The center line is, for example, a line parallel to the first side SD1 and the third side SD3.

In this way, the charging transistor TRC is arranged in a first arrangement region closer to the first side SD1 than is the center line, and the discharging transistor TRD is arranged in a second arrangement region closer to the third side SD3 than is the center line. Accordingly, the charging transistor TRC and the discharging transistor TRD, which are heat generation sources, can be efficiently laid out and arranged in the first arrangement region and the second arrangement region of the integrated circuit device 20 while increasing a distance between the charging transistor TRC and the discharging transistor TRD. By increasing the distance between the charging transistor TRC and the discharging transistor TRD, for example, it is possible to prevent heat generated by the discharging transistor TRD from affecting a temperature detection result of the first temperature sensor 41 for the charging transistor TRC. Further, it is possible to prevent heat generated by the charging transistor TRC from affecting a temperature detection result of the second temperature sensor 42 for the discharging transistor TRD. Therefore, the first temperature sensor 41 and the second temperature sensor 42 can more accurately detect the heat generated by the charging transistor TRC and the discharging transistor TRD.

Figure 13:
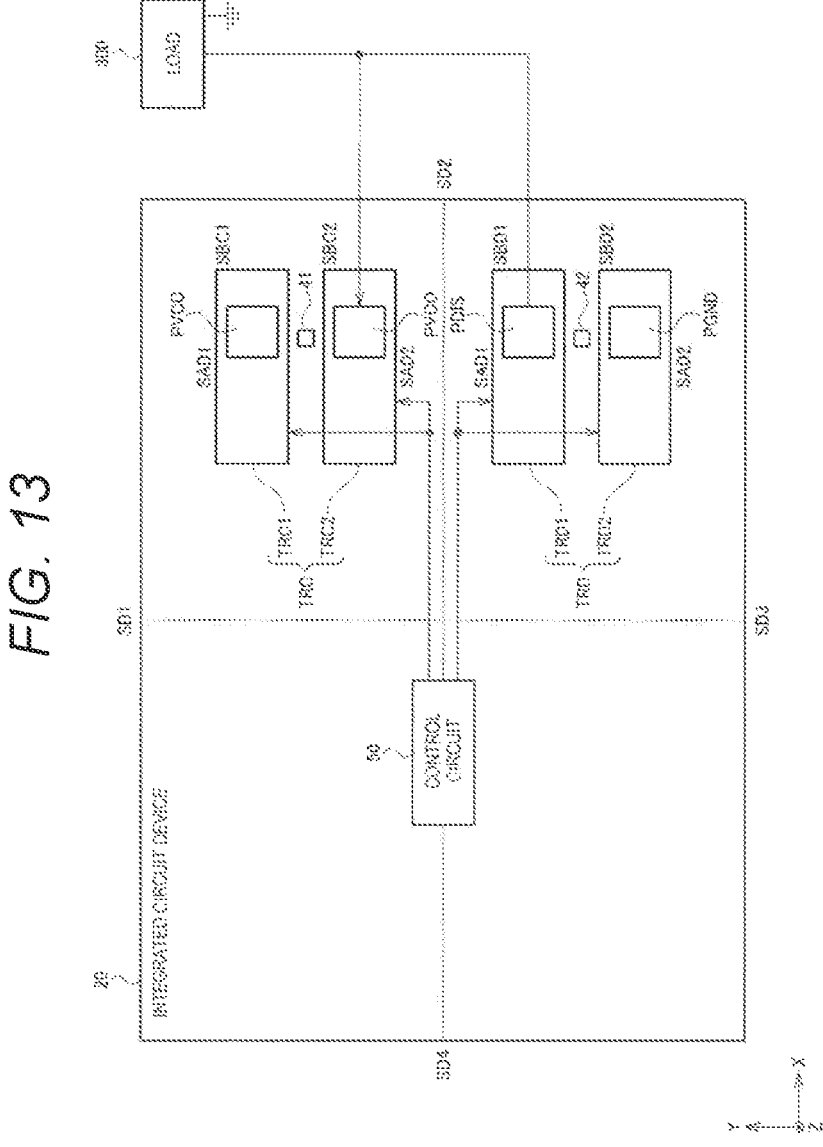
FIG. 13 shows a detailed sixth configuration example of the integrated circuit device.

FIG. 13 shows a detailed sixth configuration example of the integrated circuit device 20. In FIG. 13, the integrated circuit device 20 includes the charging transistor TRC, the discharging transistor TRD, the first temperature sensor 41, the second temperature sensor 42, the control circuit 50, a first pad PVCO, a second pad PVCC, a third pad PDIS, and a fourth pad PGND.

The first pad PVCO, the second pad PVCC, the third pad PDIS, and the fourth pad PGND are terminals of the integrated circuit device 20. The first pad PVCO, the second pad PVCC, the third pad PDIS and the fourth pad PGND are formed of, for example, a metal layer. For example, in a pad region, a metal layer is exposed from a passivation film which is an insulating layer, and the exposed metal layer forms the above-mentioned pads of the integrated circuit device 20.

The first pad PVCO is a pad for load 300 coupling. That is, the first pad PVCO is a pad for coupling the charging transistor TRC and the load 300, and corresponds to the terminal TVCO in FIG. 11. For example, a drain of the charging transistor TRC, which is a P-type transistor, is coupled to the first pad PVCO. Accordingly, the drain of the charging transistor TRC is coupled to the load 300 via the first pad PVCO. The drain of the charging transistor TRC is drains of the first charging transistor TRC1 and the second charging transistor TRC2.

The second pad PVCC is a pad for first power supply coupling. The first power supply is, for example, a power supply on a high potential side, and is a power supply having the power supply voltage VCC in FIG. 11. That is, the second pad PVCC is a pad for coupling the charging transistor TRC and the VCC which is the first power supply, and corresponds to the terminal TVCC in FIG. 11. For example, a source of the charging transistor TRC, which is a P-type transistor, is coupled to the second pad PVCC. Accordingly, the source of the charging transistor TRC is coupled to the VCC which is the first power supply via the second pad PVCC. The source of the charging transistor TRC is sources of the first charging transistor TRC1 and the second charging transistor TRC2.

The third pad PDIS is a pad for load 300 coupling. That is, the third pad PDIS is a pad for coupling the discharging transistor TRD and the load 300, and corresponds to the terminal TDIS in FIG. 11. For example, a drain of the discharging transistor TRD, which is an N-type transistor, is coupled to the third pad PDIS. Accordingly, the drain of the discharging transistor TRD is coupled to the load 300 via the third pad PDIS. The drain of the discharging transistor TRD is drains of the first discharging transistor TRD1 and the second discharging transistor TRD2.

The fourth pad PGND is a pad for second power supply coupling. The second power supply is, for example, a power supply on a low potential side, and is a power supply having the ground voltage GND in FIG. 11. The GND is also referred to as VSS. That is, the fourth pad PGND is a pad for coupling the discharging transistor TRD and the GND which is the second power supply. For example, a source of the discharging transistor TRD, which is an N-type transistor, is coupled to the fourth pad PGND. Accordingly, the source of the discharging transistor TRD is coupled to the GND via the fourth pad PGND. The source of the discharging transistor TRD is sources of the first discharging transistor TRD1 and the second discharging transistor TRD2.

In the present embodiment, as shown in FIG. 13, the first pad PVCO for load 300 coupling and the second pad PVCC for coupling the VCC which is the first power supply are provided at a region of the charging transistor TRC. That is, the first pad PVCO and the second pad PVCC are arranged so as to overlap the charging transistor TRC in a plan view. Specifically, the first pad PVCO is arranged so as to overlap the second charging transistor TRC2 in the plan view, and the second pad PVCC is arranged so as to overlap the first charging transistor TRC1 in the plan view. Further, the third pad PDIS for load 300 coupling and the fourth pad PGND for coupling the GND which is the second power supply are provided at a region of the discharging transistor TRD. That is, the third pad PDIS and the fourth pad PGND are arranged so as to overlap the discharging transistor TRD in the plan view. Specifically, the third pad PDIS is arranged so as to overlap the first discharging transistor TRD1 in the plan view, and the fourth pad PGND is arranged so as to overlap the second discharging transistor TRD2 in the plan view.

In this way, as described in FIG. 9, the heat generated by the charging transistor TRC can be dissipated to the outside through a heat dissipation route via the first pad PVCO and the second pad PVCC, and a situation where the heat is accumulated can be solved. In addition, the heat generated by the discharging transistor TRD can be dissipated to the outside through a heat dissipation route via the third pad PDIS and the fourth pad PGND, and the situation where the heat is accumulated can be solved. Further, by arranging the charging transistor TRC to overlap the first pad PVCO and the second pad PVCC, the charging transistor TRC can be coupled to the load 300 and the VCC by a short path route, and a decrease in charging efficiency or the like due to a parasitic resistance in the route can be prevented. Further, by arranging the discharging transistor TRD to overlap the third pad PDIS and the fourth pad PGND, the discharging transistor TRD can be coupled to the load 300 and the GND by a short path route, and a decrease in heat dissipation efficiency or the like due to a parasitic resistance in the route can be prevented.

As described above, an integrated circuit device according to the present embodiment includes a heating element, and a temperature sensor configured to detect a temperature of the heating element. An outer shape of the integrated circuit device has a first side and a second side intersecting the first side. When a direction along the first side of the integrated circuit device is set as an X direction and a direction along the second side is set as a Y direction, the heating element includes a first heating element, and a second heating element arranged adjacent to the first heating element along the Y direction with a region interposed therebetween. The temperature sensor is arranged at an arrangement position where a position in the X direction is a position between a center of the region and the second side, and a position in the Y direction is a position between the first heating element and the second heating element.

According to the present embodiment, since the temperature sensor is arranged closer to the second side than is the center of the region where the temperature is the highest, it is possible to reliably detect the overheated state and prevent occurrence of a malfunction caused by overheating of the heating element.

In addition, in the present embodiment, an outer shape of the region between the first heating element and the second heating element may have, for example, a first region side close to the second side and a second region side farther from the second side than is the first region side, and the temperature sensor may be arranged between the center of the region and the first region side.

In this way, since a position where the temperature is the highest changes with the elapse of time from the center of the region to the second side, by arranging the temperature sensor between the center of the region and the first region side, it is possible to detect the overheated state at an early stage and prevent occurrence of a malfunction caused by overheating of the heating element.

Further, in the present embodiment, an outer shape of the first heating element may have a first short side and a first long side. An outer shape of the second heating element may have a second short side and a second long side.

In this way, by setting the outer shape of the heating element into a shape having a long side and a short side, an area in which the heating element is in contact with the outside is increased, and the heat dissipation can be improved.

Further, in the present embodiment, a length of the first long side of the first heating element may be at least twice a length of the first short side. A length of the second long side of the second heating element may be at least twice a length of the second short side.

In this way, if a ratio of the length of the long side to the length of the short side of the outer shape of the heating element is substantially set to 2 or more, an effect of improving the heat dissipation of the heating element is remarkable.

In addition, in the present embodiment, the integrated circuit device may further include a control circuit, the first heating element may be a first transistor whose gate voltage is controlled by the control circuit, and the second heating element may be a second transistor whose gate voltage is controlled by the control circuit and which is coupled in parallel with the first transistor.

For example, it is assumed that a large current flows through a transistor used for charging or discharging a load, and a large amount of heat is generated accordingly. Therefore, according to the present embodiment, the overheated state can be reliably detected even when a transistor having a large amount of heat generation is used.

In addition, in the present embodiment, each of the first transistor and the second transistor may include a plurality of unit transistors, and a longitudinal direction of a gate of each unit transistor is a direction along the Y direction.

When the transistor includes a plurality of unit transistors, a width of the gate of each unit transistor can be reduced, and reliability of the transistor can be improved. Meanwhile, although an amount of heat generated per same area is increased, the overheated state can be efficiently detected according to the present embodiment.

In addition, an integrated circuit device according to the present embodiment includes a charging transistor configured to charge a load, a discharging transistor configured to discharge the load, a control circuit configured to control a current flowing through the charging transistor and a current flowing through the discharging transistor, a first temperature sensor configured to detect a temperature of the charging transistor, and a second temperature sensor configured to detect a temperature of the discharging transistor. An outer shape of the integrated circuit device has a first side and a second side intersecting the first side, and when a direction along the first side of the integrated circuit device is set as an X direction and a direction along the second side is set as a Y direction, the charging transistor includes a first charging transistor, and a second charging transistor arranged adjacent to the first charging transistor along the Y direction with a first region interposed therebetween. Further, the discharging transistor includes a first discharging transistor, and a second discharging transistor arranged adjacent to the first discharging transistor along the Y direction with a second region interposed therebetween. The first temperature sensor is arranged at a first arrangement position where a position in the X direction is a position between a center of the first region and the second side, and a position in the Y direction is a position between the first charging transistor and the second charging transistor, and the second temperature sensor is arranged at a second arrangement position where a position in the X direction is a position between a center of the second region and the second side, and a position in the Y direction is a position between the first discharging transistor and the second discharging transistor.

In the charging transistor, since a position where the temperature is the highest appears in the center of the first region after the start of heat generation, and extends from the center of the first region to the second side with the elapse of time, the overheated state can be reliably detected according to the present embodiment. In the discharging transistor, since the position where the temperature is the highest also appears in the center of the second region after the start of heat generation, and extends from the center of the second region to the second side with the elapse of time, the overheated state can be reliably detected according to the present embodiment.

In addition, in the present embodiment, an outer shape of the first region between the first charging transistor and the second charging transistor may have a first region side close to the second side and a second region side farther from the second side than is the first region side. An outer shape of the second region between the first discharging transistor and the second discharging transistor may have a third region side close to the second side and a fourth region side farther from the second side than is the third region side. The first temperature sensor may be arranged between the center of the first region and the first region side. The second temperature sensor may be arranged between the center of the second region and the third region side.

In this way, it is possible to detect the overheated state of the charging transistor at an early stage, and avoid a decrease in the capacity or a malfunction of a peripheral element including the charging transistor. Further, it is possible to detect the overheated state of the discharging transistor at an early stage, and avoid a decrease in the capacity or a malfunction of a peripheral element including the discharging transistor.

In addition, in the present embodiment, the outer shape of the integrated circuit device may further have a third side which is an opposite side of the first side. The charging transistor may be arranged between the first side and a center line of the first side and the third side. The discharging transistor may be arranged between the third side and the center line.

In this way, the charging transistor and the discharging transistor, which are heat generation sources, can be efficiently laid out and arranged while increasing a distance between the charging transistor and the discharging transistor.

In addition, in the present embodiment, a first pad for load coupling and a second pad for first power supply coupling may be provided at a region of the charging transistor, and a third pad for load coupling and a fourth pad for second power supply coupling may be provided at a region of the discharging transistor.

In this way, since heat generated by the charging transistor can be dissipated to the outside through a heat dissipation route via the first pad and the second pad, and heat generated by the discharging transistor can be dissipated to the outside through a heat dissipation route via the third pad and the fourth pad, a situation where the heat is accumulated can be solved.

Although the present embodiment has been described in detail above, it will be easily understood by those skilled in the art that many modifications can be made without substantially departing from the novel matters and effects of the present disclosure. Therefore, all such modifications are within the scope of the present disclosure. For example, a term cited with a different term having a broader meaning or the same meaning at least once in the specification or in the drawings can be replaced with the different term in any place in the specification or in the drawings. In addition, all combinations of the present embodiment and the modifications are also included in the scope of the present disclosure. Further, the configurations and operations of the integrated circuit device, the heating element, the transistor, the charging transistor, the discharging transistor, the control circuit and the temperature sensor are not limited to those described in the present embodiment, and various modifications can be made.

What is claimed is:

1. An integrated circuit device, comprising:
a charging transistor configured to charge a load;
a discharging transistor configured to discharge the load;
a control circuit configured to control a current flowing through the charging transistor and a current flowing through the discharging transistor;
a first temperature sensor configured to detect a temperature of the charging transistor; and
a second temperature sensor configured to detect a temperature of the discharging transistor, wherein
an outer shape of the integrated circuit device has a first side and a second side intersecting the first side, when a direction along the first side of the integrated circuit device is set as an X direction and a direction along the second side is set as a Y direction,
the charging transistor includes a first charging transistor, and a second charging transistor arranged adjacent to the first charging transistor along the Y direction with a first region interposed therebetween,
the discharging transistor includes a first discharging transistor, and a second discharging transistor arranged adjacent to the first discharging transistor along the Y direction with a second region interposed therebetween,
the first temperature sensor is arranged at a first arrangement position where a position in the X direction is a position between a center of the first region and the second side, and a position in the Y direction is a position between the first charging transistor and the second charging transistor, and
the second temperature sensor is arranged at a second arrangement position where a position in the X direction is a position between a center of the second region and the second side, and a position in the Y direction is a position between the first discharging transistor and the second discharging transistor.

2. The integrated circuit device according to claim 1, wherein
an outer shape of the first region between the first charging transistor and the second charging transistor has a first region side close to the second side and a second region side farther from the second side than is the first region side,
an outer shape of the second region between the first discharging transistor and the second discharging transistor has a third region side close to the second side and a fourth region side farther from the second side than is the third region side,
the first temperature sensor is arranged between the center of the first region and the first region side, and
the second temperature sensor is arranged between the center of the second region and the third region side.

3. The integrated circuit device according to claim 1, wherein
the outer shape of the integrated circuit device further has a third side which is an opposite side of the first side,
the charging transistor is arranged between the first side and a center line of the first side and the third side, and
the discharging transistor is arranged between the third side and the center line.

4. The integrated circuit device according to claim 1, wherein
a first pad for load coupling and a second pad for first power supply coupling are provided at a region of the charging transistor, and
a third pad for load coupling and a fourth pad for second power supply coupling are provided at a region of the discharging transistor.

* * * * *